United States Patent [19]
Wenz et al.

[11] Patent Number: 5,155,565
[45] Date of Patent: Oct. 13, 1992

[54] METHOD FOR MANUFACTURING AN AMORPHOUS SILICON THIN FILM SOLAR CELL AND SCHOTTKY BARRIER DIODE ON A COMMON SUBSTRATE

[75] Inventors: Robert P. Wenz; Nang T. Tran, both of Cotage Grove, Minn.

[73] Assignee: Minnesota Mining and Manufacturing Company, St. Paul, Minn.

[21] Appl. No.: 517,447

[22] Filed: Apr. 24, 1990

Related U.S. Application Data

[62] Division of Ser. No. 152,895, Feb. 5, 1988, abandoned.

[51] Int. Cl.$^5$ .................. H01L 27/14; H01L 29/48; H01L 45/00; H01L 29/12
[52] U.S. Cl. .................. 357/30; 357/15; 357/2; 357/58; 136/244
[58] Field of Search .......... 357/30 G, 30 H, 30, 357/15, 2, 4, 58, 47, 67, 71; 136/244

[56] References Cited

U.S. PATENT DOCUMENTS

| | | | |
|---|---|---|---|
| 3,411,050 | 11/1968 | Middleton et al. | 317/234 |
| 3,952,324 | 4/1976 | Wolff et al. | 357/19 |
| 3,981,691 | 9/1976 | Cuneo | 29/195 |
| 4,022,585 | 5/1977 | Kaye | 428/551 |
| 4,084,985 | 4/1978 | Evans, Jr. | 136/89 |
| 4,136,436 | 1/1979 | Kilby et al. | 29/572 |
| 4,142,195 | 2/1979 | Carlson et al. | 357/15 |
| 4,163,677 | 8/1979 | Carlson et al. | 136/89 |
| 4,215,156 | 7/1980 | Dalal et al. | 427/84 |
| 4,266,984 | 5/1981 | Wronski et al. | 437/83 |
| 4,321,299 | 3/1982 | Frazer | 428/247 |
| 4,329,699 | 5/1982 | Ishihara et al. | 357/2 |
| 4,410,558 | 10/1983 | Izu et al. | 427/39 |
| 4,419,530 | 12/1983 | Nath | 136/251 |
| 4,428,110 | 1/1984 | Kim | 29/872 |
| 4,433,202 | 2/1984 | Marayama et al. | 136/255 |
| 4,438,723 | 3/1984 | Cannella et al. | 118/718 |
| 4,443,651 | 4/1984 | Swartz | 136/249 |
| 4,454,372 | 6/1984 | Appleby | 136/250 |

(List continued on next page.)

FOREIGN PATENT DOCUMENTS

| | | |
|---|---|---|
| 0078541 | 11/1982 | European Pat. Off. . |
| 0074642 | 3/1983 | European Pat. Off. ........... 357/15 |
| 0093513 | 4/1983 | European Pat. Off. . |
| 3517414 | 5/1985 | Fed. Rep. of Germany . |
| 2577716 | of 1986 | France . |
| 56-013778 | 2/1981 | Japan ............... 136/244 |
| 56-13779 | 2/1981 | Japan ............... 136/244 |
| 56-069871 | 6/1981 | Japan ............... 136/244 |
| 57-75534 | 5/1982 | Japan . |
| 0204180 | 12/1982 | Japan ............... 136/244 |
| 59-165469 | 3/1983 | Japan . |
| 60-218882 | 4/1984 | Japan . |
| 0160181 | 8/1985 | Japan ............... 136/244 |
| 0115869 | 5/1987 | Japan ............... 357/15 |
| 62-244179 | 10/1987 | Japan ............... 136/244 |

OTHER PUBLICATIONS

Yano et al., *Roll-ToRoll Preparation of a Hydrogenated Amorphous Silicon Solar Cell on a Polymer Film Substrate*, "Thin Solid Films" 146 (1987) pp. 75–81.

(List continued on next page.)

*Primary Examiner*—Mark V. Prenty
*Attorney, Agent, or Firm*—Gary L. Griswold; Walter N. Kirn; Walter C. Linder

[57] ABSTRACT

A thin film p-i-n solar cell and Schottky barrier diode are fabricated adjacent one another on a common flexible polyimide substrate. A titanium nitride diffusion barrier prevents contaminants of an aluminum contact layer on the substrate from reacting with the semiconductor body of the solar cell and diode during subsequent fabrication. An n+-type hydrogenated amorphous silicon layer overlies the layer of titanium nitride, and forms an ohmic contact with the solar cell and diode. The diode includes an n-type layer of silicon doped with phosphorus to a concentration of $10^{18}$ to $10^{20}$ atoms per cubic centimeter to increase its forward current density. The solar cell and diode are separated from one another by an epoxy strip. A top conducting oxide layer forms a Schottky barrier with the semiconductor body of the diode.

20 Claims, 3 Drawing Sheets

U.S. PATENT DOCUMENTS

| | | | |
|---|---|---|---|
| 4,481,265 | 11/1984 | Ezawa et al. | 429/9 |
| 4,481,378 | 11/1984 | Leak | 136/244 |
| 4,492,743 | 1/1985 | Howe | 429/111 |
| 4,511,756 | 4/1985 | Moeller et al. | 136/258 |
| 4,514,579 | 4/1985 | Hanak | 136/249 |
| 4,514,583 | 4/1985 | Izu et al. | 136/259 |
| 4,517,403 | 5/1985 | Morel et al. | 136/249 |
| 4,530,739 | 7/1985 | Hanak et al. | 204/4 |
| 4,544,571 | 10/1985 | Miller | 427/40 |
| 4,585,490 | 4/1986 | Raffel et al. | 148/1.5 |
| 4,586,980 | 5/1986 | Hirai et al. | 156/655 |
| 4,605,813 | 8/1986 | Takeuchi et al. | 136/244 |
| 4,612,409 | 9/1986 | Hamakawa et al. | 136/244 |
| 4,624,045 | 11/1986 | Ishihara et al. | 29/572 |
| 4,633,034 | 12/1986 | Nath et al. | 136/256 |
| 4,636,579 | 1/1987 | Hanak et al. | 136/245 |
| 4,638,109 | 1/1987 | Ishihara et al. | 136/244 |
| 4,650,984 | 3/1987 | Furushima et al. | 250/211 |
| 4,667,058 | 5/1987 | Catalano et al. | 136/244 |
| 4,683,176 | 7/1987 | Nakamura et al. | 428/692 |
| 4,695,859 | 9/1987 | Guha et al. | 357/2 |
| 4,696,702 | 9/1987 | Ellis, Jr. et al. | 437/88 |
| 4,697,041 | 9/1987 | Okaniwa et al. | 136/244 |
| 4,740,431 | 4/1988 | Little | 136/244 |
| 4,820,393 | 4/1989 | Brat et al. | 204/192.15 |

OTHER PUBLICATIONS

Thompson et al.,—*Silicide Formation In Pd-a-Si:H Schottky Barriers,* "Appl. Phys. Lett." 39(3), Aug. 1, 1981 pp. 274-276.

C. R. Wronski et al., "Surface Staes and Barrier Heights of Metal-Amorphous Silicon Schottky Barriers", *Solid State Communications,* 1977, vol. 23, pp. 421-424.

Motorola, Inc., Motorola Rectifiers and Zener Diodes Data Book, 1988, Title Page, pp. 3-47 and 3-50.

METHOD FOR MANUFACTURING AN AMORPHOUS SILICON THIN FILM SOLAR CELL AND SCHOTTKY BARRIER DIODE ON A COMMON SUBSTRATE

This is a divisional of application Ser. No. 07/152,895, filed Feb. 5, 1988 (now abandoned).

CROSS-REFERENCE TO COPENDING APPLICATIONS

Reference is hereby made to copending applications entitled "Sealing of Polymide Film", filed on Mar. 2, 1988, and assigned Ser. No. 07/163,520 and now abandoned, and "Interconnected Semiconductor Devices", filed Dec. 10, 1987, and assigned Ser. No. 131,416 and now U.S. Pat. No. 4,873,201. Both of these applications are assigned to the same assignee as the present invention.

BACKGROUND OF THE INVENTION

1. Field of the Invention

The present invention relates generally to Schottky barrier thin-film diodes. In particular, the present invention is a method for fabricating an amorphous silicon, thin film solar cell and Schottky barrier diode on a common flexible substrate.

2. Description of the Prior Art

Glow-discharge-produced, hydrogenated, amorphous silicon, thin-film, Schottky barrier diodes were first reported by Wronski et al. in an article entitled "Surface States and Barrier Heights of Metal-Amorphous Silicon Schottky Barriers" in *Solid State Communications*, Vol. 23, 1977, pp. 421–424. Schottky barriers were formed between Al, Ni, Cr, Pd, Au, Rh and Pt metal films and undoped amorphous silicon film. The undoped, hydrogenated, amorphous silicon (a-Si:H) was deposited from a DC discharge in silane onto a substrate held at 320° C. to 350° C. These substrates consisted of a three hundred angstrom thick phosphorus-doped a-Si layer on stainless steel which formed an ohmic or a low resistance contact to the undoped amorphous silicon film.

The study of metal-amorphous silicon Schottky barrier thin film diodes continues. In an article entitled "Silicide Formation in Pd-a-Si:H Schottky Barriers" in *Appl. Phys. Lett.*, 39(3), Aug. 1, 1981, pp. 274–276, Thompson et al reported on amorphous silicon Schottky barrier thin film diodes with palladium. Palladium Schottky barriers were fabricated on quartz substrates. Cr or Ni was deposited to form a bottom electrode, followed by the subsequent deposition of a five hundred angstrom phosphorus doped n+a-Si:H layer and an undoped a-Si:H layer having a thickness of 0.2 to 2.0 micrometers. They obtained a forward current density of $1 \times 10^{-2}$ A/cm$^2$ at one volt. This appears to be one of the highest forward current densities reported in the literature for metal-amorphous silicon barrier thin film diodes.

Thin film diodes are in widespread use. In general, thin film manufacturing techniques are less expensive and produce higher yields than wafer scale processing techniques used to fabricate crystalline or so-called "discrete" diodes. However, known thin film diodes have characteristics which are poorly suited for many applications. The rigid substrates on which they are fabricated prohibits their use in applications in which the device must be physically deformed. Contaminants from metallic contact layers often react with the semiconductor body during processing, degrading the diode's electrical characteristics. Since they are typically used with other semiconductor devices, the diodes must be separately fabricated and interconnected.

It is evident that there is a continuing need for improved, thin-film Schottky barrier diodes. A diode which can be fabricated using more cost effective, roll-to-roll processing techniques is desired. If a diode of this type were flexible it could be more readily shaped for applications in which planar devices are not suited. Production yields and diode characteristics can be improved if contaminants in the metal layer are isolated during fabrication. Schottky diodes having even larger forward current densities are of course desired. Diodes having these characteristics would be most useful if they could be efficiently fabricated on integrated circuits with other semiconductor devices.

SUMMARY OF THE INVENTION

The present invention is a method for manufacturing an amorphous silicon thin film Schottky barrier diode and solar cell on a common substrate. A thin, flexible substrate having a metallic contact layer is provided. A first layer of hydrogenated amorphous silicon of a first conductivity type and a first conductivity value is deposited on the contact layer of the substrate. A second layer of intrinsic-type hydrogenated amorphous silicon is deposited over a solar cell portion on the first layer of silicon. A third layer of hydrogenated amorphous silicon of the first conductivity type and a second conductivity value is deposited over a diode portion on the first layer of silicon, adjacent the second layer of silicon. A fourth layer of hydrogenated amorphous silicon of a second conductivity type and a third conductivity value is deposited over the solar cell portion on the second layer of silicon. The second and third layers of silicon are separated from one another at the intersection of the diode and solar cell portions by an insulating material. A layer of conductive material is deposited on the second layer over the diode portion, and on the fourth layer over the solar cell portion. The layer of conductive material forms a Schottky barrier with the second layer of silicon at the diode portion.

In a preferred embodiment, the substrate is provided as a roll of thin, flexible polyimide substrate having a contact layer which includes a stainless steel bonding layer deposited on the polyimide substrate, an aluminum metal layer deposited on the bonding layer, and a titanium nitride diffusion barrier layer deposited on the aluminum. The method is carried out using a roll-to-roll process in a glow-discharge apparatus. The first layer is a layer of n+-type silicon. Depositing the second layer includes masking the diode portion. Depositing the third layer includes masking the solar cell portion and depositing a third layer of n-type silicon. Depositing the fourth layer includes masking the diode portion and depositing a fourth layer of p+-type silicon. The solar cell and diode portions are separated by laser cutting.

Thin film diodes in accordance with the present invention are well suited to a variety of applications in view of their flexible nature. The n+ layer of silicon, which can be doped with phosphorus to a concentration of $10^{18}$ to $10^{20}$ atoms per cubic centimeter, results in a high forward current density. Contamination of the semiconductor body by the aluminum during fabrication is prevented by the titanium nitride diffusion barrier. Production yields and diode characteristics are thereby improved. Furthermore, the diodes can be efficiently interconnected in a circuit and used in conjunction with the solar cells.

BRIEF DESCRIPTION OF THE DRAWINGS

FIG. 9 is a cross-sectional representation of the integrated circuit at an intermediate point in its manufacture, with a laser separating the diode and solar cell portions.

FIG. 10 is a cross-sectional representation of the diode shown in FIG. 9, with insulating material applied to the separation between the diode and solar cell portions.

FIG. 11 is a cross-sectional representation of an integrated circuit which includes a solar cell and Schottky barrier diode in accordance with a second embodiment of the present invention.

DETAILED DESCRIPTION OF THE PREFERRED EMBODIMENTS

Figure 1:
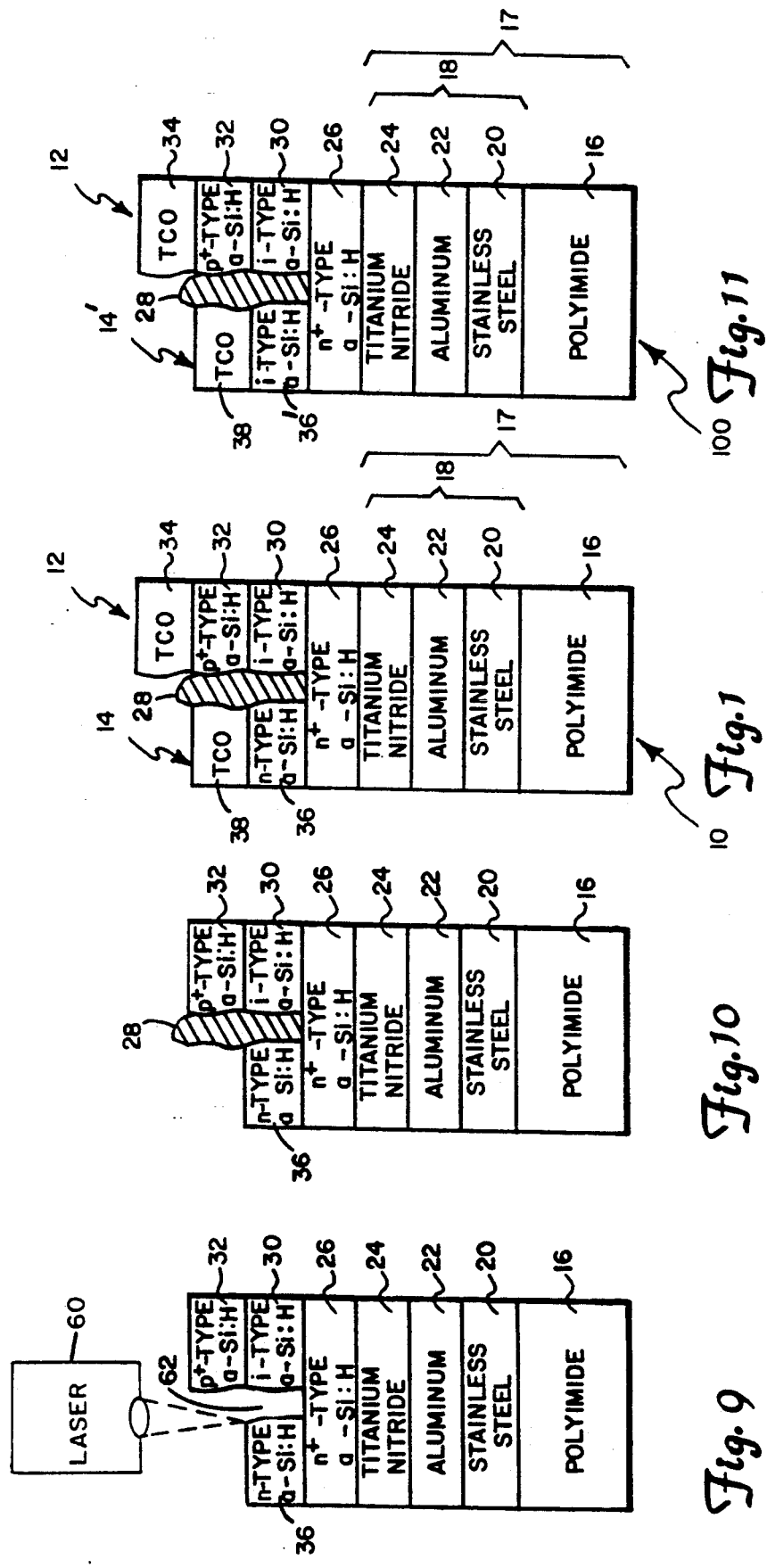
FIG. 1 is a cross-sectional representation of an integrated circuit which includes a solar cell and Schottky barrier diode in accordance with one embodiment of the present invention.

A first embodiment of the present invention, a thin film monolithic integrated circuit 10 which includes a p-i-n solar cell 12 and Schottky barrier diode 14 fabricated on a common metallized substrate 17, is illustrated generally in FIG. 1. Metallized substrate 17 is formed by a metallic (conductive) contact layer 18 which overlies a substrate 16. Substrate 16 is preferably a thin, flexible and insulating substrate formed from a plastic material such as polyimide or polyester. Polyimide substrates of these types are known and commercially available. In the embodiment shown, metallic contact layer 18 includes a stainless steel bonding layer 20, an aluminum metal layer 22, and a titanium nitride diffusion barrier layer 24. Stainless steel layer 20 strongly bonds to polyimide substrate 16 and provides good adhesion for the remaining layers. Other metals or conductive materials can be used in place of aluminum in layer 22. Titanium nitride (TiN) layer 24 overlies aluminum layer 22 and forms the upper layer of contact layer 18 and metallized substrate 17.

The semiconductor bodies of solar cell 12 (i.e. the solar cell portion of integrated circuit 10) and diode 14 (diode portion) have in common a first layer 26 of $n^+$-type hydrogenated amorphous silicon (a first conductivity type semiconductor having a first conductivity value). First layer 26 of hydrogenated amorphous silicon (a-Si:H) overlies titanium nitride diffusion barrier 60 layer 24 and forms an ohmic contact between metallic contact layer 18 and the semiconductor bodies of solar cell 12 and diode 14. As shown in FIG. 1, solar cell 12 and diode 14 are adjacent to one another on integrated circuit 10, and separated by an epoxy insulating wall or strip 28. The body of p-i-n solar cell 12 also includes a second layer 30 of intrinsic-type (i-type) hydrogenated amorphous silicon which overlies silicon layer 26, and a $p^+$-type layer 32 of hydrogenated amorphous silicon (a second conductivity type material having a second conductivity value) overlying layer 30. A contact layer 34 of conductive material overlies layer 32. In the embodiment shown, contact layer 34 is formed by a top conducting oxide (TCO) layer which forms an ohmic contact with silicon layer 32. The top electrode can also be formed using metals for contact layer 34, as is well known in the art.

The body of Schottky diode 14 also includes an n-type layer 36 of hydrogenated amorphous silicon (the first conductivity type material having a third conductivity value) which overlies layer 26. A TCO contact layer 38 overlies layer 36. In one embodiment layer 36 is a layer of intrinsic silicon which is slightly doped with phosphorus to a concentration of approximately $10^{18}$ to $10^{20}$ atoms per cubic centimeter ($PH_3/SiH_4 = 1 \times 10^{-4}$, or less than one-tenth of one percent, in the gas phase). Other group V elements can also be used for doping. Conducting oxide layer 38 is a conductive material which forms a Schottky barrier with n-type silicon layer 36. As is well known, metals or other conducting materials can be used in layer 36 to form Schottky barriers.

Integrated circuit 10 and Schottky diode 14 have advantageous features over those known in the art. Since integrated circuit 10 is formed on a flexible substrate, roll-to-roll processes such as those described below can be used for large area and cost effective manufacture. Unlike single crystal devices, the diode and solar cell are compact and resilient - - - not fragile. The flexible nature of the circuit enables it to be shaped as needed for individual applications. Since diode 14 is fabricated on the same substrate as solar cell 12, these two devices can be efficiently interconnected to form electric circuits. In one embodiment a plurality of diodes 14 are coupled in series as blocking diodes with a series arrangement of solar cells 12. All of these devices can be fabricated on a common substrate using the methods disclosed herein. The use of titanium nitride as a diffusion barrier prevents contaminants from the aluminum metal layer from reacting with the amorphous silicon body of the solar cell and diode during fabrication. Titanium nitride is inert during normal deposition, yet will not detrimentally affect current flow between the layers of aluminum and silicon.

The use of slightly doped silicon layer 36 in diode 14 has been found to reduce the forward biased threshold voltage of diode 14, while increasing its forward current density. These advantages are achieved without severely reducing the reverse breakdown voltage of diode 14. Forward current densities greater than one ampere per square centimeter have been observed in experiments. This current density is one hundred times larger than reported state-of-the-art current densities. The diode also has a threshold voltage of 0.15 to 0.20 volt, which is the same as that for single crystal silicon Schottky diodes.

Figure 2:
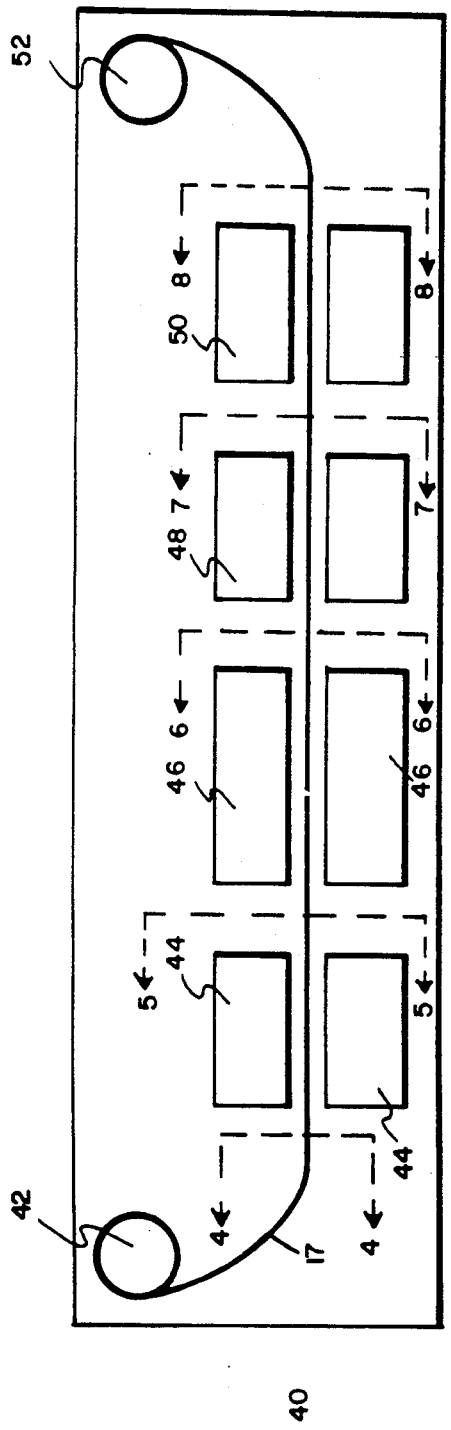
FIG. 2 is a diagrammatic representation, taken from the side, illustrating apparatus used to manufacture the integrated circuit shown in FIG. 1.
Figure 3:
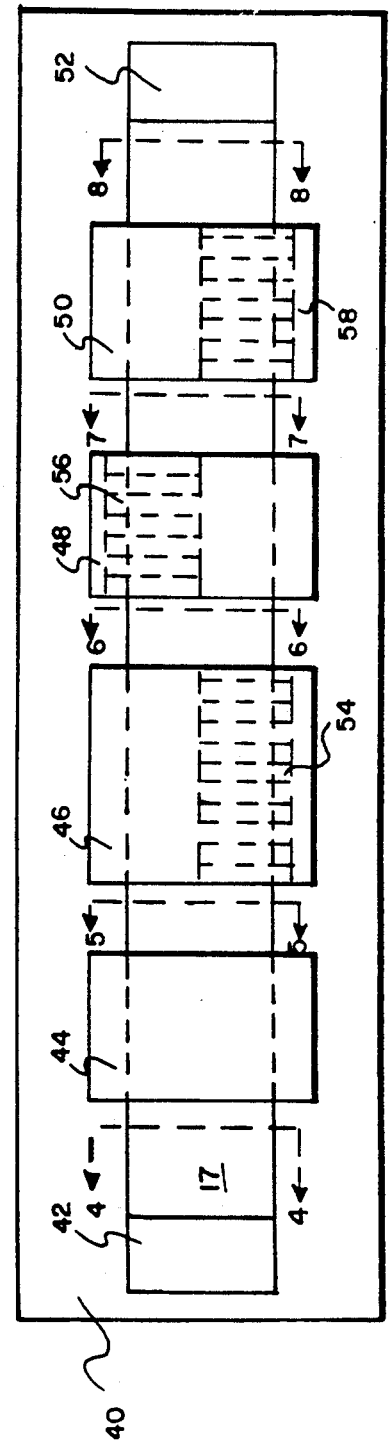
FIG. 3 is a diagrammatic representation, taken from the top, illustrating apparatus used to manufacture the integrated circuit shown in FIG. 1.
Figures 4, 5, 6, 7, 8:
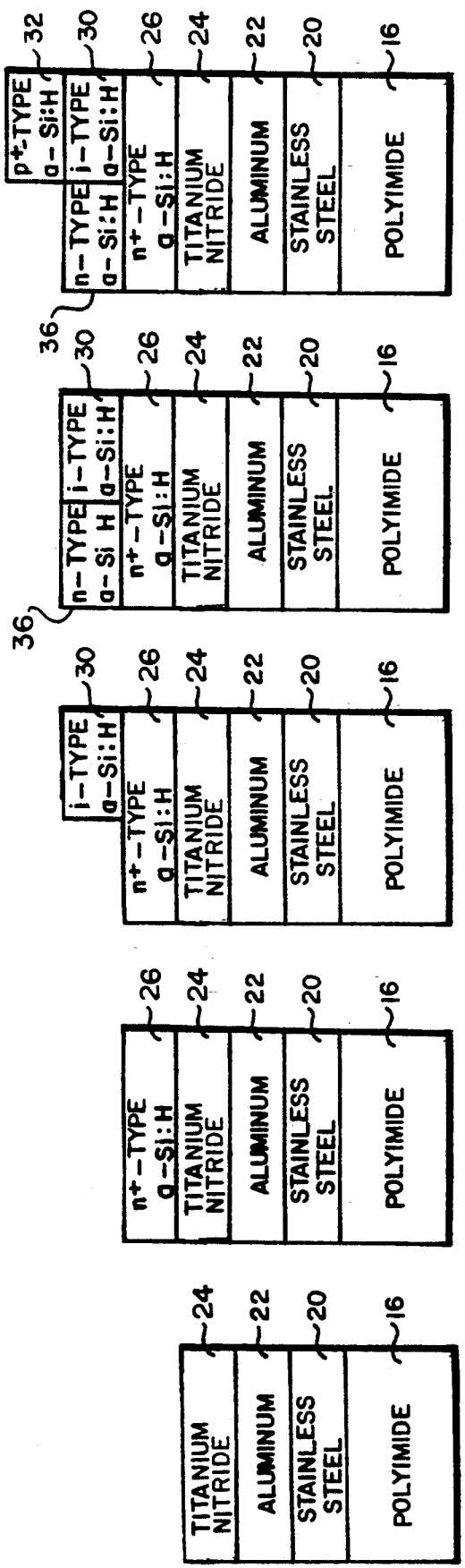
FIGS. 4–8 are cross-sectional illustrations of the integrated circuit at intermediate points of manufacture in the apparatus shown in FIGS. 2 and 3.

A method for fabricating integrated circuit 10 is described with reference to FIGS. 2-10. As shown in FIGS. 2 and 3, integrated circuit 10 is manufactured using a roll-to-roll process carried out within main vacuum chamber 40. A feed roll 42 of metallized substrate 17 is positioned within main vacuum chamber 40. An end of metallized substrate 17 is then passed through a series of miniature vacuum chambers 44, 46, 48 and 50, before being wound onto takeup roll 52. In preferred embodiments the roll of metallized substrate 17 will have been fabricated to include the polyimide substrate 16 and metallization layer 18 illustrated in FIG. 1. Stainless steel layer 20, aluminum layer 22 and titanium nitride layer 24 can be deposited on substrate 16 in any known or conventional manner, such as sputtering. In one embodiment aluminum layer 22 has a thickness of one thousand to three thousand angstroms, and titanium nitride layer 24 has a thickness of one hundred to three hundred angstroms. Layer 20 of stainless steel has a thickness of fifty to two hundred angstroms. In still other embodiments, polyimide substrate 16 is encapsulated or surrounded by stainless steel in accordance with the method described in the copending application entitled "Sealing of Polyimide Film", filed on even date. Metallized substrate 17 can also be cleaned utilizing known glow discharge techniques (not shown) before entering vacuum chamber 44. A cross-sectional representation of metallized substrate 17 as it leaves roll 42, and before it enters vacuum chamber 44, is illustrated in FIG. 4.

Silicon layer 26 is deposited on metallized substrate 17 as it passes through vacuum chamber 44. This film is deposited on all portions of the substrate over which it is desired to fabricate diodes 14 and solar cells 12 in accordance with the present invention. In one embodiment, the silicon is phosphorus doped and deposited to a thickness of two hundred to four hundred, and preferably three hundred angstroms. A cross-section of metallized substrate 17 having silicon layer 26 deposited thereon is illustrated in FIG. 5.

After leaving vacuum chamber 44, the metallized substrate with deposited layer 26 enters vacuum chamber 46. As illustrated diagrammatically in FIG. 3, a mask 54 is mounted within chamber 46 above a portion of the substrate upon which Schottky diode 14 is to be fabricated. Layer 30 of intrinsic-type silicon is then deposited only on a section of metallized substrate 17 over which it is desired to form solar cell 12. Silicon layer 30 can be deposited to a thickness of three thousand to seven thousand angstroms, and preferably to a thickness of five thousand and five hundred angstroms. A cross-sectional representation of the metallized substrate 17 with deposited layers 26 and 30 is illustrated in FIG. 6.

The metallized substrate with layers 26 and 30 next enters vacuum chamber 48. As illustrated in FIG. 3, vacuum chamber 48 has a mask 56 positioned adjacent a portion of metallized substrate 17 over which solar cell 14 is to be fabricated. An n-type film or layer 36 of silicon is then deposited over the portion of the substrate on which diode 14 is to be fabricated. A cross-sectional representation of metallized substrate 17 with layers 26, 30 and 36 deposited thereon is shown in FIG. 7. N-type silicon layer 36 can be deposited to a thickness of three thousand to ten thousand angstroms. Layer 36 is deposited to a thickness of five thousand angstroms in one preferred embodiment.

After emerging from vacuum chamber 48, metallized substrate 17 with deposited layers 26, 30, and 36 enters vacuum chamber 50. As shown diagrammatically in FIG. 3, a mask 58 is positioned within vacuum chamber 50 above a portion of metallized substrate 17 over which Schottky diode 14 is to be fabricated. A p+-type silicon layer 32 is thereby deposited above silicon layer 30. Layer 32 can be deposited to a thickness of one hundred to two hundred angstroms, and preferably to a thickness of one hundred and fifty angstroms. A cross-sectional representation of metallized substrate 17 having the silicon layers 26, 30, 32 and 36 deposited thereon is illustrated in FIG. 8. Metallized substrate 17 with silicon layers 26, 30, 32 and 36 is wound onto takeup reel 52 after leaving chamber 50. Although only one diode 14 and solar cell 12 are shown in FIGS. 1 and 4–8 for purposes of this example, it will be appreciated that a plurality of diodes 14 and solar cells 12 can be formed on metallized substrate 17 using the masking procedures described herein.

The roll of metallized substrate 17 with deposited layers 26, 30, 32 and 36 is next removed from takeup reel 52 and further processed to separate silicon layers 30 and 36 from one another above layer 26. As illustrated in FIG. 9, this separation can be performed using a laser 60 which cuts a gap 62 between layers 30 and 36. Gap 62 is then filled to a point above layer 32 with an insulating substance such as epoxy 64. The integrated circuit in this intermediate stage of fabrication is illustrated in FIG. 10.

Finally, top conducting oxide layers 34 and 38 (or other metallic substances) are applied to silicon layers 30 and 32, respectively, in a known or conventional manner. Utilizing these fabrication steps, integrated circuit 10 is formed with thin film solar cell 12 and Schottky barrier diode 14 positioned adjacent one another. Solar cell 12 and diode 14 are electrically interconnected by metallic contact layer 18. It is also evident that a plurality of diodes 14 and solar cells 12 can be formed adjacent one another utilizing this method. The above described processing steps can be performed in conventional capacitance radio frequency (RF) glow discharge apparatus. Other techniques such as photochemical vapor deposition can also be used. Silane, hydrogen and phosphine can be used as gases. During fabrication, substrate 16 can be maintained at a temperature within the range of 200°–300° C., and preferably at 250° C. The RF power density can be in the range of 0.01 to 0.1 watts per square centimeter, and is 0.037 watts per square centimeter in one preferred embodiment. The pressure can be kept at 0.25 to 1.5 torr, and is 1.0 torr in a preferred embodiment.

Further processing of integrated circuit 10 is required prior to its intended use. In one embodiment, integrated circuit 10 can be wrapped around a battery (not shown) to provide continuous charging. In this embodiment, integrated circuit 10 will be fabricated to include a plurality of solar cells 12 adjacent one another and connected in a series arrangement. Metal bus bars (not shown) can be used to interconnect solar cells 12 and diodes 14. Solar cells 12 and diodes 14 can, for example, be interconnected in a manner described in application Ser. No. 131,416, filed Dec. 10, 1987, entitled "Interconnected Semiconductor Devices". When integrated circuit 10 is used in this manner, Schottky diodes 14 can be connected in series and used as blocking diodes to prevent discharge of the battery through solar cell 12. Diodes such as 14 can also be used in conjunction with solar cells 12 as "bypass" diodes. Any conventional and known technique can be used to interconnect diode 14 to solar cell 12.

A second preferred embodiment of the present invention, integrated circuit 100, is illustrated in FIG. 11. Integrated circuit 100 is similar to that of integrated circuit 10 previously described, and identical reference symbols are used to describe identical portions. Integrated circuit 100 includes p-i-n solar cell 12 fabricated adjacent to a Schottky barrier diode 14' on a common metallized substrate 17. As is evident, the only difference between diode 14' and diode 14 is that a layer 36' of intrinsic-type hydrogenated amorphous silicon is deposited on silicon layer 26 in integrated circuit 100, as opposed to the n-type silicon layer 36 of diode 10. Integrated circuit 100 can be fabricated using the method described with reference to FIGS. 2-10 by removing mask 54 within miniature chamber 46, and omitting the deposition carried out in chamber 48. Diode 14' of integrated circuit 100 will not have the increased forward current density and associated advantages of diode 14 which result from the n-type silicon of layer 36.

Although the present invention has been described with reference to the preferred embodiments, those skilled in the art will recognize that changes may be made in form and detail without departing from the spirit and scope of the invention.

What is claimed is:

1. An amorphous silicon thin film p-i-n solar cell and Schottky barrier diode on a common substrate, including:
   a substrate;
   a first conductive layer on the substrate;
   an unseparated amorphous silicon ohmic contact layer over a solar cell portion and a diode portion on the first conductive layer;
   one or more layers of amorphous silicon forming a diode body over the diode portion on the ohmic contact layer, including a layer of n-type silicon doped to a concentration of $10^{18}$ to $10^{20}$ atoms per cubic centimeter with an element from Group V on the periodic table;
   at least two layers of amorphous silicon forming a p-i-n solar cell body in conjunction with the ohmic contact layer over the solar cell portion on the ohmic contact layer, adjacent to and spaced from the diode body to form a separation between the solar cell body and the diode body;
   insulating material within the separation between the diode body and solar cell body, the diode body and solar cell body electrically interconnected by the first conductive and ohmic contact layers; and
   a second conductive layer on the diode body and on the solar cell body, the diode body forming a Schottky barrier with the second conductive layer.

2. The solar cell and diode of claim 1 wherein the substrate includes a thin, flexible and plastic substrate.

3. The solar cell and diode of claim 2 wherein the substrate includes a polyimide substrate.

4. The solar cell and diode of claim 1 wherein the first conductive layer includes:
   a metal layer deposited over the substrate; and
   a titanium nitride diffusion barrier layer deposited on the metal layer.

5. The solar cell and diode of claim 4 wherein the metal layer includes a layer of aluminum.

6. The solar cell and diode of claim 4 wherein the titanium nitride diffusion barrier is deposited to a thickness in the range of one hundred to three hundred angstroms.

7. The solar cell and diode of claim 1 wherein the diode body includes a layer of n-type silicon doped with phosphorus to a concentration of $10^{18}$ to $10^{20}$ atoms per cubic centimeter.

8. The solar cell and diode of claim 1 wherein the ohmic contact layer includes an unseparated layer of $n^+$-type silicon deposited on the first conductive layer.

9. A thin film Schottky diode, including:
   a substrate;
   a first layer of conductive material;
   a semiconductor body adjacent to the first layer of conductive material and including a layer of n-type silicon doped to a concentration of $10^{18}$ to $10^{20}$ atoms per cubic centimeter with an element from Group V on the periodic table; and
   a second layer of conductive material on the semiconductor body opposite the first layer of conductive material, the semiconductor body forming an ohmic contact with one of the first and second layers of conductive material, and a Schottky barrier with the other layer.

10. The Schottky diode of claim 9 wherein the substrate includes a thin, flexible and insulating plastic substrate.

11. The Schottky diode of claim 9 wherein the layer of silicon is doped with phosphorous to a concentration of $10^{18}$ to $10^{20}$ atoms per cubic centimeter.

12. The thin film Schottky diode of claim 9 wherein the first layer of conductive material includes a metal layer on the substrate and a titanium nitride diffusion barrier layer over the metal layer.

13. The Schottky diode of claim 12 wherein the metal layer includes an aluminum metal layer.

14. The Schottky diode of claim 9 wherein the first layer of conductive material is an ohmic contact layer of $n^+$-type amorphous silicon.

15. An amorphous silicon thin film p-i-n solar cell and Schottky barrier diode on a common substrate, including:
   a substrate;
   a lower and unseparated conductive layer over a solar cell portion and a diode portion on the substrate;
   an unseparated $n^+$-type amorphous silicon ohmic contact layer over the solar cell portion and the diode portion on the lower conductive layer;
   a Schottky diode body over the diode portion on the ohmic contact layer, including:
      an n-type layer of amorphous silicon doped with a Group V dopant to a concentration of $10^{18}$ to $10^{20}$ atoms per cubic centimeter; and
      an upper conducting layer on and forming a Schottky barrier with the n-type layer of amorphous silicon;
   a p-i-n solar cell body over the solar cell portion on the ohmic contact layer, the solar cell body spaced from the diode body, electrically interconnected to the diode body on the conductive and ohmic contact layers, and including:
      an undoped amorphous silicon layer on the ohmic contact layer;
      a $p^+$-type amorphous silicon layer on the undoped silicon layer; and
      an upper conducting layer on the $p^+$-type layer; and
   an insulating material in the space between the diode and solar cell bodies.

16. The solar cell and diode of claim 15 wherein the n-type layer includes a layer of amorphous silicon doped with phosphorous.

17. The solar cell and diode of claim 15 wherein the conductive layer includes:
   a layer of stainless steel;
   a layer of aluminum on the layer of stainless steel; and
   a titanium nitride diffusion barrier layer on the layer of aluminum.

18. An amorphous silicon thin film diode, including:

a substrate;

a layer of conductive material on the substrate;

an $n^+$-type amorphous silicon ohmic contact layer on the layer of conductive material;

an n-type layer of amorphous silicon doped to a concentration of $10^{18}$-$10^{20}$ atoms per cubic centimeter with an element from Group V on the periodic table; and a layer of conductive material on the n-type layer of amorphous silicon and forming a Schottky barrier with the n-type layer.

19. The diode of claim 18 wherein the n-type layer includes a layer of amorphous silicon doped with phosphorous.

20. The diode of claim 18 wherein the layer of conductive material includes:

a layer of stainless steel;

a layer of aluminum on the layer of stainless steel; and a titanium nitride diffusion barrier layer on the layer of aluminum.

* * * * *